United States Patent
Cheng

(10) Patent No.: US 7,280,419 B1
(45) Date of Patent: Oct. 9, 2007

(54) LATENCY COUNTER HAVING FREQUENCY DETECTOR AND LATENCY COUNTING METHOD THEREOF

(75) Inventor: Wen-Chang Cheng, Tao-Yuan (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 0 days.

(21) Appl. No.: 11/556,195

(22) Filed: Nov. 3, 2006

(30) Foreign Application Priority Data

Sep. 11, 2006 (TW) .............................. 95133436 A

(51) Int. Cl.
*G11C 7/00* (2006.01)
(52) U.S. Cl. .................. 365/194; 365/233; 327/149; 327/158
(58) Field of Classification Search ............... 365/194, 365/233; 327/149, 158, 159, 152, 153, 161
See application file for complete search history.

(56) References Cited

U.S. PATENT DOCUMENTS

| | | | | |
|---|---|---|---|---|
| 5,498,990 A | * | 3/1996 | Leung et al. | ............... 327/323 |
| 5,831,467 A | * | 11/1998 | Leung et al. | ............... 327/319 |
| 6,687,185 B1 | * | 2/2004 | Keeth et al. | ................ 365/233 |
| 6,968,025 B2 | * | 11/2005 | Tanahashi | ................... 375/355 |
| 7,092,480 B1 | * | 8/2006 | Younis | ....................... 377/122 |
| 2005/0105349 A1 | | 5/2005 | Dahlberg | |

* cited by examiner

*Primary Examiner*—Anh Phung
*Assistant Examiner*—Hien N Nguyen
(74) *Attorney, Agent, or Firm*—Winston Hsu

(57) ABSTRACT

The present invention discloses a latency counter applied to a memory, for delaying a memory accessing control signal. The latency counter includes: a clock delay module for applying at least one delay amount to the input clock to generate a delayed input clock; a frequency detector for detecting a frequency of a specific signal of the memory to set the delay amount; and a delay control signal generating module for generating a first delayed control signal and a second delayed control signal corresponding to the delayed input clock and the memory accessing control signal respectively, wherein timing of the first delayed control signal is earlier than timing of the second delayed control signal.

9 Claims, 4 Drawing Sheets

LATENCY COUNTER HAVING FREQUENCY DETECTOR AND LATENCY COUNTING METHOD THEREOF

BACKGROUND OF THE INVENTION

1. Field of the Invention

The present invention relates to a latency counter, which is applied to a memory, and more particularly relates to a latency counter having a frequency detector, and a method thereof.

2. Description of the Prior Art

In recent times, random access memory (RAM) has become an increasingly important component in modern electronic devices. In order to increase the writing/reading data rate of the random access memory (RAM), the technique of double data rate (DDR) has become more and more important. A random access memory that utilizes the technique of double data rate is known as a double data rate random access memory (DDR RAM). Normally, when a microprocessor is ready to access a memory, the microprocessor transmits a reading signal to the control circuit of the memory, wherein the reading signal is synchronized with an external clock. In addition, according to prior art, a latency counter is coupled between the microprocessor and the control circuit, for providing a delay time (delay clock period number) to the reading signal in order to guarantee that there is enough time for the memory to access the specific address. Furthermore, because of the wide operating frequency range of the memory, the latency counter needs to have a different delay clock period number at a high operating frequency from that at a low operating frequency. In other words, when operating at the high operating frequency, the delay clock period number should be larger, but when operating at the low operating frequency, the delay clock period number should be smaller. However, the intrinsic delay of the circuit will affect the synchronization between the external clock and the reading signal. In other words, when operating at the high operating frequency, the intrinsic delay of the circuit may be higher than the clock period of the high operating frequency; thus the latency counter may output an error latency delay when the reading signal has slight non-synchronicity with the external clock, and the control circuit will read the error signal consequently. Furthermore, the latency counter designed for being utilized at a high memory operating frequency having a larger delay period number is not appropriate to be used at a low memory operating frequency having a smaller delay period number.

SUMMARY OF THE INVENTION

Therefore, one of the objectives of the present invention is to provide a latency counter having a frequency detector for adjusting the delay period number, and a method thereof, to solve the above-mentioned problems.

According to an embodiment of the present invention, a latency counter is disclosed. The latency counter is applied to a memory for delaying a memory accessing control signal. The latency counter comprises: a clock delay module, a frequency detector, and a delay control signal generating module. The clock delay module is coupled to an input clock for applying at least one delay amount to the input clock to generate a delayed input clock; the frequency detector is coupled to the clock delay module for detecting a frequency of a specific signal of the memory to set the delay amount; and the delay control signal generating module is coupled to the delayed input clock and the memory accessing control signal, for generating a first delayed control signal and a second delayed control signal corresponding to the delayed input clock and the memory accessing control signal respectively; wherein timing of the first delayed control signal is earlier than timing of the second delayed control signal.

According to an embodiment of the present invention, a latency counting method is disclosed. The latency counting method is applied to a memory for delaying a memory accessing control signal, the method comprising: delaying an input clock of the memory to generate a delayed input clock according to a delay amount; detecting a frequency of a specific signal of the memory to set the delay amount; and generating a first delayed control signal and a second delayed control signal corresponding to the memory accessing control signal according to the delayed input clock and the memory accessing control signal respectively; wherein timing of the first delayed control signal is earlier than timing of the second delayed control signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
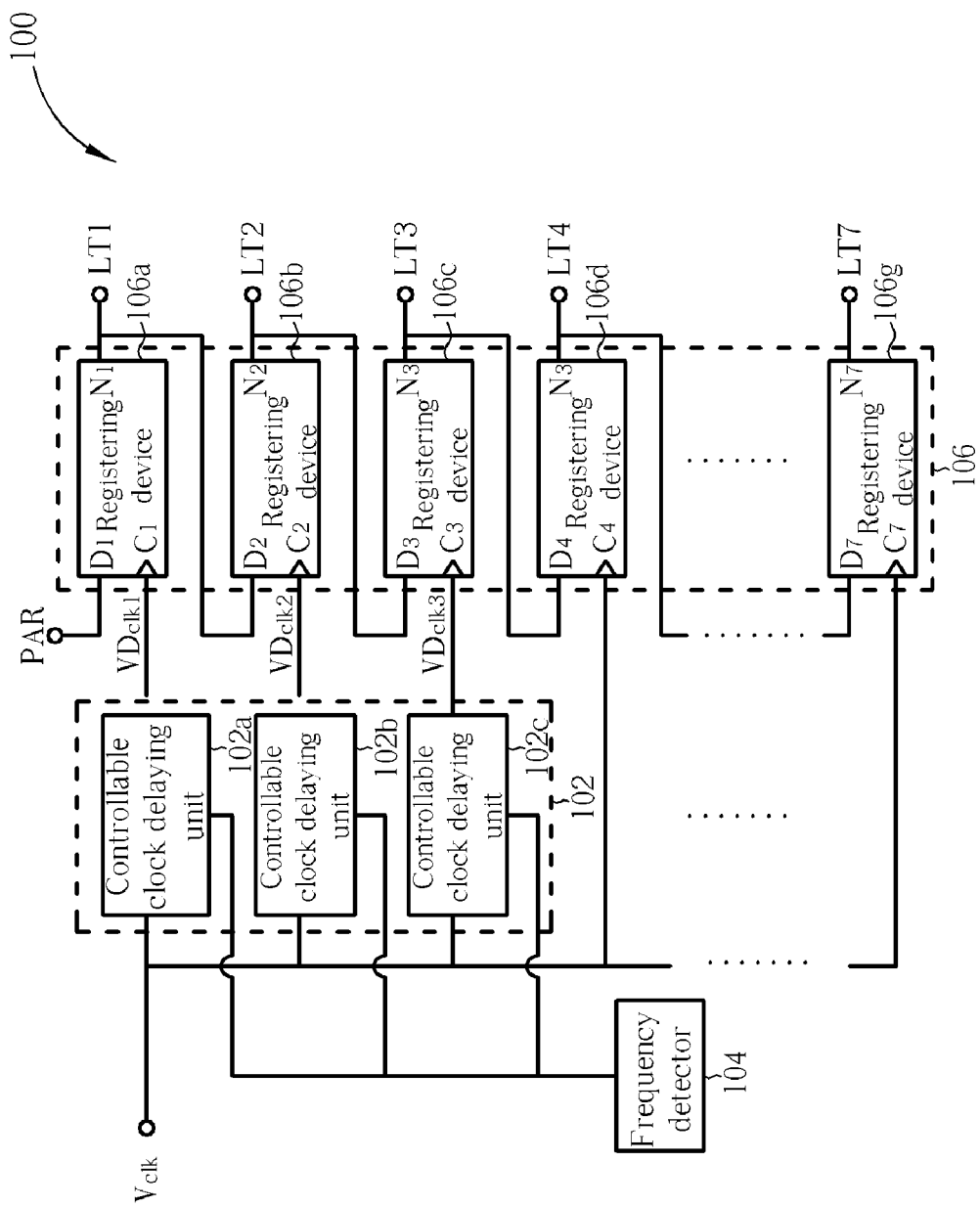
FIG. 1 is a diagram illustrating a latency counter according to an embodiment of the present invention.

Please refer to FIG. 1. FIG. 1 is a diagram illustrating a latency counter 100 applied to a memory, according to an embodiment of the present invention. The latency counter 100 is utilized for delaying a memory accessing control signal PAR as shown in FIG. 1. The latency counter 100 comprises a clock delay module 102, a frequency detector 104, and a delay control signal generating module 106. The clock delay module 102 is coupled to an input clock $V_{clk}$ for applying a plurality of delay amounts $D_1, D_2, D_3$ to the input clock $V_{clk}$ to generate a plurality of delayed input clocks $VD_{clk1}, VD_{clk2}, VD_{clk3}$ respectively. The frequency detector 104 is coupled to the clock delay module 102 for detecting a frequency $f_{clk}$ of a specific signal (the input clock $V_{clk}$) of the memory to set the delay amounts $D_1$, $D_2$, $D_3$. In this embodiment, the input clock $V_{clk}$ is the operating clock of the memory. The delay control signal generating module 106 is coupled to the delayed input clocks $VD_{clk1}$, $VD_{clk2}$, $VD_{clk3}$, the input clock $V_{clk}$, and the memory accessing control signal PAR for generating a plurality of delayed control signals LT1~LT7 corresponding to the memory accessing control signal PAR according to the delayed input clocks $VD_{clk1}$, $VD_{clk2}$, $VD_{clk3}$, and the memory accessing control signal PAR; wherein timing of the first delayed control signal LT1 is earlier than timing of the second delayed control signal LT2, timing of the second delayed control signal LT2 is earlier than timing of the third delayed control signal LT3, and so on. According to the latency counter 100 of the present invention, the clock delay module 102 comprises a controllable clock delaying unit 102a for providing the delay amount $D_1$ to the input clock $V_{clk}$ in order to generate the delayed input clocks $VD_{clk1}$; a controllable clock delaying unit 102b for providing the delay amount $D_2$ to the input clock $V_{clk}$ in order to generate the delayed input clocks $VD_{clk2}$; and a controllable clock delaying unit 102c for providing the delay amount $D_3$ to the input clock $V_{clk}$ in order to generate the delayed input clocks $VD_{clk3}$. The delay control signal generating module 106 comprises a registering device 106a, which is implemented by a flip-flop in this embodiment, for reading the memory accessing control signal PAR (data terminal $D_1$) according to the triggering of the delayed input clock $VD_{clk1}$ (clock terminal $C_1$) to generate the delayed control signal LT1 (output terminal $N_1$); a registering device 106b for reading the delayed control signal LT1 (data terminal $D_2$) according to the triggering of the delayed input clock $VD_{clk2}$ (clock terminal $C_2$) to generate the delayed control signal LT2 (output terminal $N_2$); and a registering device 106c for reading the delayed control signal LT2 (data terminal $D_3$) according to the triggering of the delayed input clock $VD_{clk3}$ (clock terminal $C_3$) to generate the delayed control signal LT3 (output terminal $N_3$). Please note that, in order to describe the spirit of the present invention more clearly, the delay control signal generating module 106 of the latency counter 100 further comprises registering devices 106d, ..., 106g, wherein the clock terminals $C_4$, $C_5$, $C_6$, $C_7$ are coupled to the input clock $V_{clk}$, and the data terminals $D_4$, $D_5$, $D_6$, $D_7$ are coupled to the output terminals $N_3$, $N_4$, $N_5$, $N_6$ respectively, for generating the delayed control signal LT4, ..., LT7 respectively, as shown in FIG. 1. Please note that the latency counter 100 of the present invention only utilizes three controllable clock delaying devices; however, in another embodiments, the circuit designer can also utilize any number of controllable clock delaying devices according to circuit requirements, and this modification also belongs within the scope of the present invention.

Figure 2:
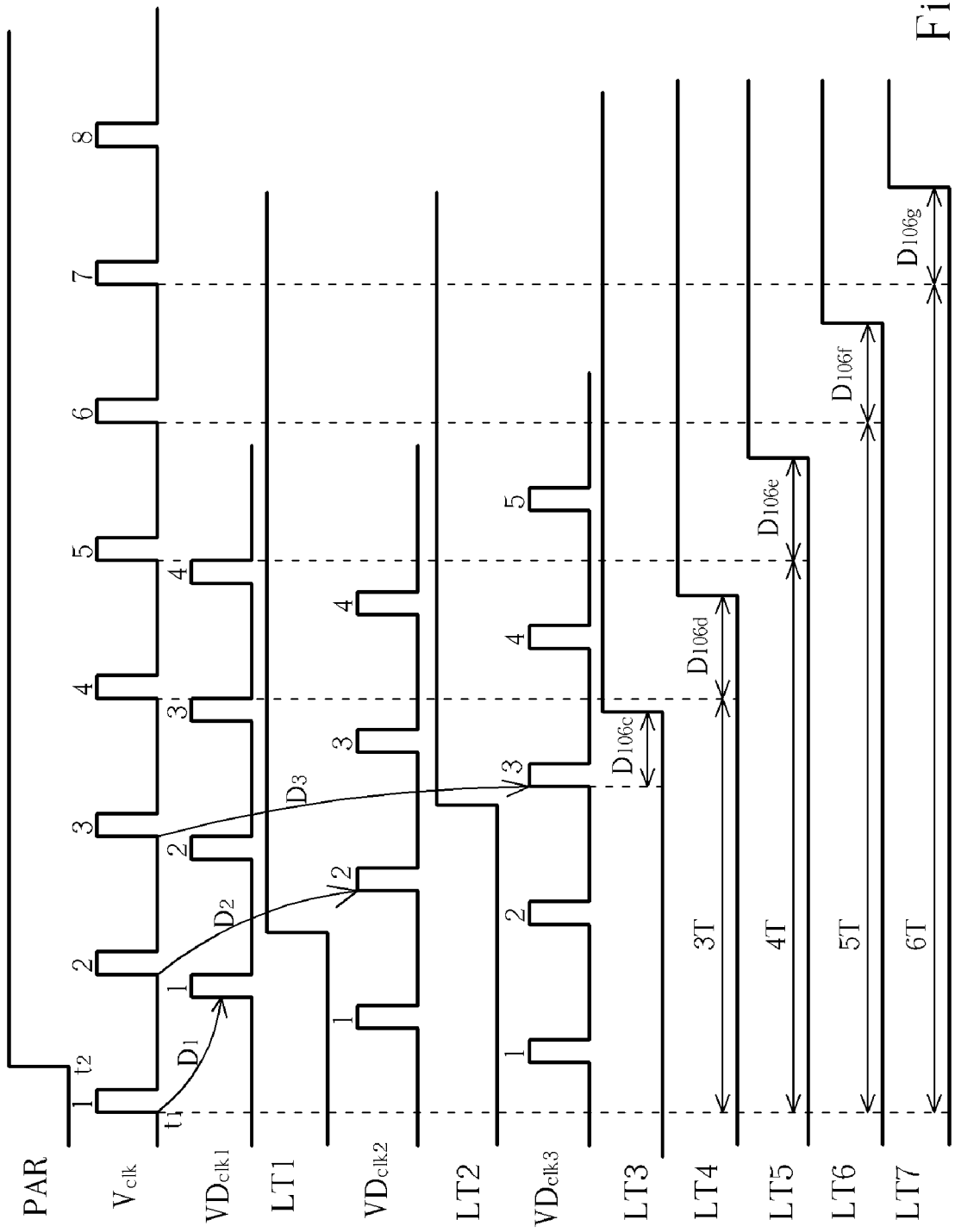
FIG. 2 is a timing diagram of the latency counter in FIG. 1 when operated at a high accessing frequency mode.

Normally, the operation of the memory may be set into a high accessing frequency mode (utilizing a higher memory clock) and a low accessing frequency mode (utilizing a lower memory clock). In high accessing frequency mode, the user always selects the delayed control signal with a larger delay amount in order to access the memory accurately, such as the delayed control signal LT5, LT6, or LT7. Therefore, when the frequency detector 104 detects that the frequency $f_h$ of the input clock $V_{clk}$ is a high frequency, the frequency detector 104 will set the above mentioned three delay amounts $D_1$, $D_2$, $D_3$ to be not equal to zero, wherein the values of $D_1$, $D_2$, $D_3$ can be determined through the operating requirement of the memory. Please refer to FIG. 2. FIG. 2 is a timing diagram of the latency counter 100 in FIG. 1 when operating at the high accessing frequency mode. In this embodiment, if the latency counter 100 receives the first clock of the input clock $V_{clk}$ (having clock period T) at time $t_1$, then the memory accessing control signal PAR will be transmitted to the clock terminal $C_1$ of the registering device 106a at time $t_2$ after the first clock, and the clock terminal $C_1$ of the registering device 106a will receive the delayed input clock $VD_{clk1}$ at time $t_1+D_1$. Therefore, the output terminal $N_1$ of the registering device 106a will output the delayed control signal LT1 at time $t_1+D_1+D_{106a}$, as shown in FIG. 2, wherein $D_{106a}$ is the delay time of the registering device 106a. Then, because the controllable clock delaying unit 102b provides a delay amount $D_2$ to the second clock of the input clock $V_{clk}$, the clock terminal $C_2$ of the registering device 106b will receive the delayed input clock $VD_{clk2}$ at time $t_1+T+D_2$. Therefore, the output terminal $N_2$ of the registering device 106b will output the delayed control signal LT2 at time $t_1+T+D_2+D_{106b}$, wherein $D_{106b}$ is the delay time of the registering device 106b. Similarly, because the controllable clock delaying unit 102c provides a delay amount $D_3$ to the third clock of the input clock $V_{clk}$, the clock terminal $C_3$ of the registering device 106c will receive the delayed input clock $VD_{clk3}$ at time $t_1+2T+D_3$. Therefore, the output terminal $N_3$ of the registering device 106c will output the delayed control signal LT3 at time $t_1+2T+D_3+D_{106c}$, wherein $D_{106c}$ is the delay time of the registering device 106c. Then, the delayed control signal LT3 will be transmitted to the next stage data terminal $D_3$ of the registering device 106d. At the same time, the clock terminal $C_3$ of the registering device 106d waits for a next rising edge of the input clock $V_{clk}$ to trigger the registering device 106d, which is the fourth clock of the input clock $V_{clk}$. The delayed control signal LT4 will then be outputted at time $t_1+3T+D_{106d}$, as shown in FIG. 2, wherein $D_{106d}$ is the delay time of the registering device 106d. Similarly, the delayed control signals LT5, LT6, and LT7 are generated at time $t_1+4T+D_{106e}$, $t_1+5T+D_{106f}$, and $t_1+6T+D_{106g}$ respectively, wherein $D_{106e}$, $D_{106f}$, and $D_{106g}$ are the delay time of the registering devices 106e, 106f, and 106g respectively. The three delay amounts $D_1$, $D_2$, and $D_3$ are different from each other, and when in the high accessing frequency mode, $D_1 > D_2 > D_3$, as shown in FIG. 2.

Figure 3:
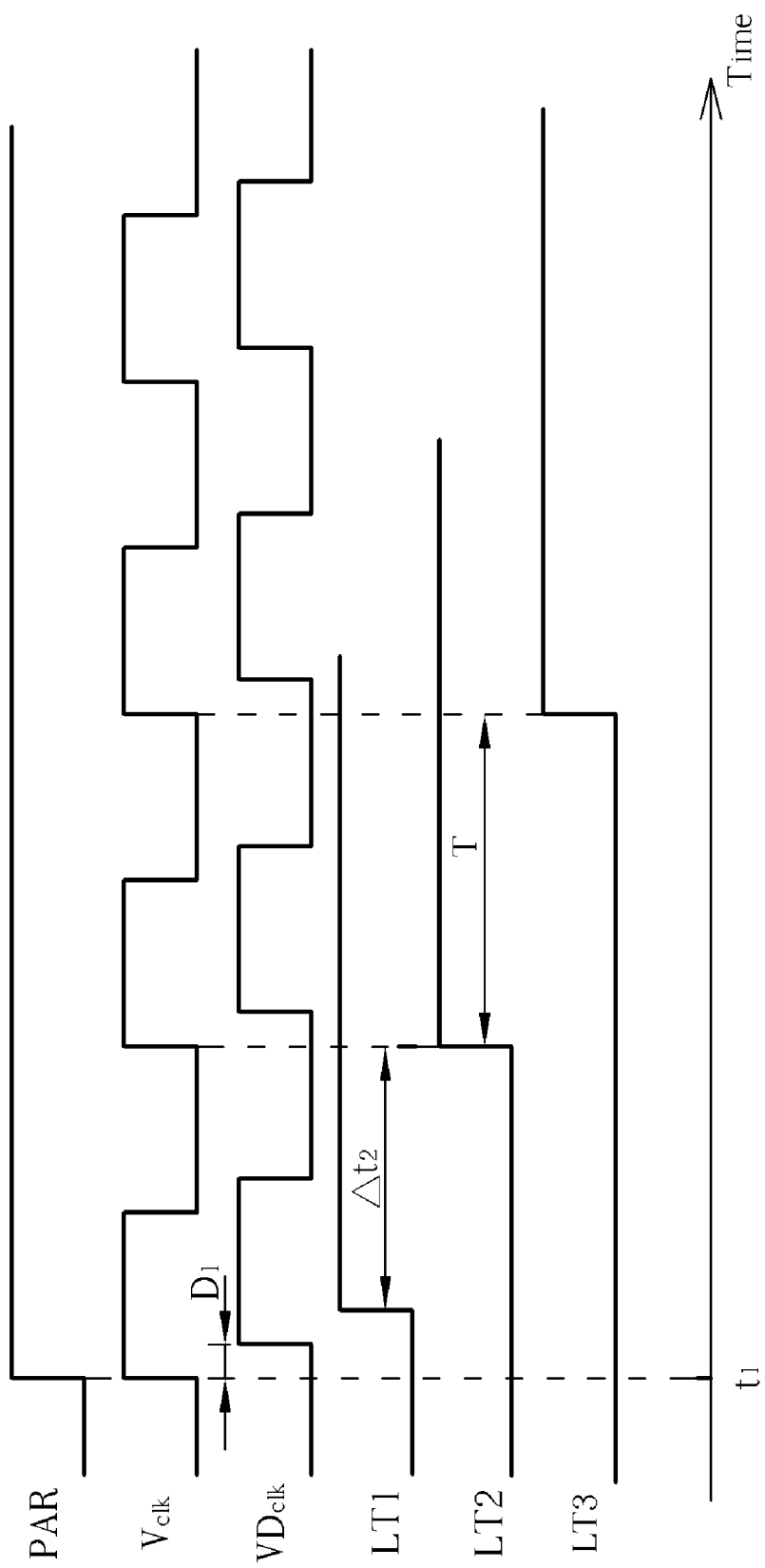
FIG. 3 is a timing diagram of the latency counter in FIG. 1 when operated at a low accessing frequency mode.

On the other hand, when in the low accessing frequency mode, the user always selects the delayed control signal with a smaller delay amount, such as the delayed control signal LT2 or LT3. Therefore, when the frequency detector 104 detects that the frequency $f_1$ of the input clock $V_{clk}$ is a low frequency, the frequency detector 104 will set the above mentioned two delay amounts $D_2$ and $D_3$ to be equal to zero, and only the delay amount $D_1$ provided by the controllable clock delaying unit 102a is utilized for delaying the input clock $V_{clk}$. Please refer to FIG. 3. FIG. 3 is a timing diagram of the latency counter 100 in FIG. 1 when operating in the low accessing frequency mode. In this embodiment, if the latency counter 100 receives the input clock $V_{clk}$ and the memory accessing control signal PAR at time $t_1$, then the clock terminal $C_1$ of the registering device 106a will receive the delayed input clock $VD_{clk1}$ at time $t_1+D_1$. Therefore, the output terminal $N_1$ of the registering device 106a will output the delayed control signal LT1 after the time $t_1+D_1$, as shown in FIG. 3. Furthermore, because the delay amounts $D_2$ and $D_3$ are set to zero, the clock terminal $C_2$ of the registering device 106b will wait for the next rising edge of the input clock $V_{clk}$ to trigger the registering device 106b, and then output the delayed control signal LT2 at time $t_1+D_1+\Delta t_2$, as shown in FIG. 3. Similarly, the delayed control signal LT3 is outputted at time $t_1+D_1+\Delta t_2+T$.

Figure 4:
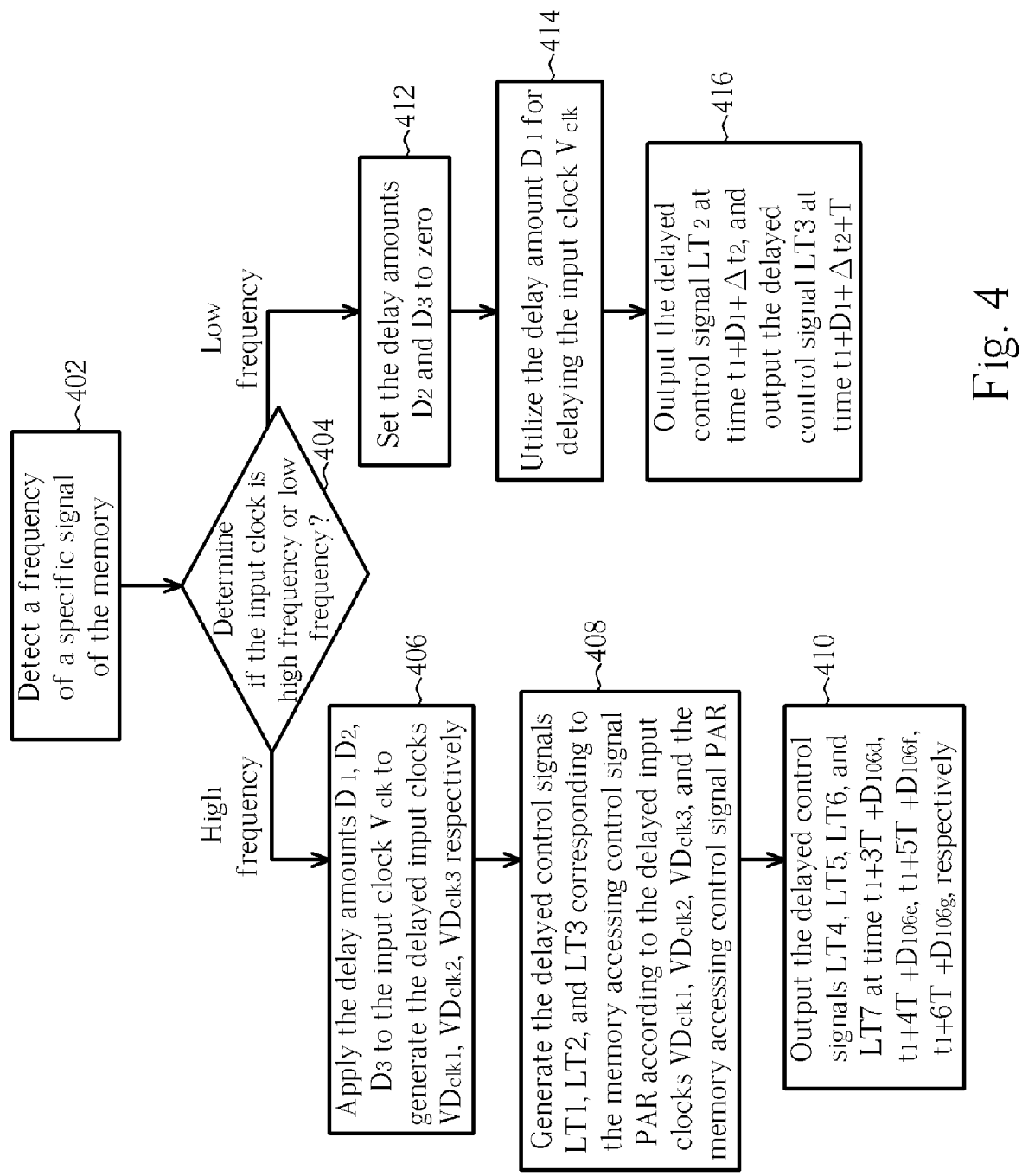
FIG. 4 is a flowchart illustrating a latency counting method according to an embodiment of the present invention.

Please refer to FIG. 4. FIG. 4 is a flowchart illustrating a latency counting method according to an embodiment of the present invention. The latency counting method is applied to the latency counter 100 of FIG. 1, for delaying a memory accessing control signal PAR of the memory, and the method can be simplified to the steps below:

Step 402: Detect a frequency $f_{clk}$ of a specific signal (input clock $V_{clk}$) of the memory;

Step 404: Determine if the input clock $V_{clk}$ is high frequency or low frequency; if high frequency, go to step 406; if low frequency, go to step 412;

Step 406: Apply the delay amounts $D_1$, $D_2$, $D_3$ to the input clock $V_{clk}$ to generate the delayed input clocks $VD_{clk1}$, $VD_{clk2}$, $VD_{clk3}$ respectively;

Step 408: Generate the delayed control signals LT1, LT2, and LT3 corresponding to the memory accessing control signal PAR according to the delayed input clocks $VD_{clk1}$, $VD_{clk2}$, $VD_{clk3}$, and the memory accessing control signal PAR; wherein timing of the delayed control signal LT1 is earlier than timing of the delayed control signal LT2, and timing of the delayed control signal LT2 is earlier than timing of the delayed control signal LT3;

Step 410: Output the delayed control signals LT4, LT5, LT6, and LT7 at time $t_1+3T+D_{106d}$, $t_1+4T+D_{106e}$, $t_1+5T+D_{106f}$, and $t_1+6T+D_{106g}$ respectively;

Step 412: Set the delay amounts $D_2$ and $D_3$ to zero;

Step 414: Utilize the delay amount $D_1$ for delaying the input clock $V_{clk}$; and Step 416: Output the delayed control signal LT2 at time $t_1+D_1+\Delta t_2$, and output the delayed control signal LT3 at time $t_1+D_1+\Delta t_2+T$.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A latency counter, applied to a memory for delaying a memory accessing control signal, the latency counter comprising:
   a clock delay module, coupled to an input clock, for applying at least one delay amount to the input clock to generate a delayed input clock;
   a frequency detector, coupled to the clock delay module, for detecting a frequency of a specific signal of the memory to set the delay amount; and
   a delay control signal generating module, coupled to the delayed input clock, the input clock, and the memory accessing control signal, for generating a first delayed control signal and a second delayed control signal corresponding to the delayed input clock and the memory accessing control signal respectively; wherein timing of the first delayed control signal is earlier than timing of the second delayed control signal.

2. The latency counter of claim 1, wherein the clock delay module comprises:
   a first controllable clock delaying unit, for providing a first delay amount to the input clock to generate a first delayed input clock; and
   a second controllable clock delaying unit, for providing a second delay amount to the input clock to generate a second delayed input clock; and
   the delay control signal generating module comprises:
   a first register device, triggered by the first delayed input clock for reading the memory accessing control signal to generate the first delayed control signal; and
   a second register device, triggered by the second delayed input clock for reading the first delayed control signal to generate a third delayed control signal; wherein when the frequency detector detects that the frequency of the specific signal is a first frequency, the frequency detector sets the second delay amount to zero; and when the frequency detector detects that the frequency of the specific signal is a second frequency higher than the first frequency, the frequency detector does not set the second delay amount to zero.

3. The latency counter of claim 2, wherein the frequency detector further controls the first delay amount at the second frequency to be larger than the first delay amount at the first frequency.

4. The latency counter of claim 1, wherein the specific signal is an operating clock of the memory.

5. The latency counter of claim 1, wherein the frequency detector detects the input clock, and arbitrarily sets the delay amount adapted to any frequency of the input clock according to a detecting result.

6. A latency counting method, applied to a memory for delaying a memory accessing control signal, the method comprising:
   delaying an input clock of the memory to generate a delayed input clock according to a delay amount;
   detecting a frequency of a specific signal of the memory to set the delay amount; and
   generating a first delayed control signal and a second delayed control signal corresponding to the memory accessing control signal according to the delayed input clock and the memory accessing control signal respectively; wherein timing of the first delayed control signal is earlier than timing of the second delayed control signal.

7. The latency counting method of claim 6, wherein the step of delaying the input clock of the memory to generate the delayed input clock according to the delay amount comprises:
   providing a first delay amount upon the input clock to generate a first delayed input clock; and
   providing a second delay amount upon the input clock to generate a second delayed input clock; and
   the step of generating the first delayed control signal and the second delayed control signal corresponding to the memory accessing control signal according to the delayed input clock and the memory accessing control signal comprises:
   reading the memory accessing control signal according to the triggering of the first delayed input clock to generate the first delayed control signal; and
   reading the first delayed control signal according to the triggering of the second delayed input clock to generate a third delayed control signal;
   wherein when the frequency of the specific signal is detected to be a first frequency, the second delay amount is set to zero; and when the frequency of the specific signal is detected to be a second frequency higher than the first frequency, the second delay amount is not set to zero.

8. The latency counting method of claim 7, wherein the step of detecting the frequency of the specific signal of the memory to set the delay amount further comprises:
   controlling the first delay amount at the second frequency to be larger than the first delay amount at the first frequency.

9. The latency counting method of claim 6, wherein the specific signal is an operating clock of the memory.

* * * * *